US012503763B2

(12) United States Patent
Komori et al.

(10) Patent No.: US 12,503,763 B2
(45) Date of Patent: Dec. 23, 2025

(54) SUBSTRATE PROCESSING APPARATUS AND SUBSTRATE PROCESSING METHOD

(71) Applicant: Tokyo Electron Limited, Tokyo (JP)

(72) Inventors: Eiichi Komori, Nagoya (JP); Tsuneyuki Okabe, Nagoya (JP)

(73) Assignee: Tokyo Electron Limited, Tokyo (JP)

( * ) Notice: Subject to any disclaimer, the term of this patent is extended or adjusted under 35 U.S.C. 154(b) by 74 days.

(21) Appl. No.: 17/933,209

(22) Filed: Sep. 19, 2022

(65) Prior Publication Data
US 2023/0093077 A1 Mar. 23, 2023

(30) Foreign Application Priority Data

Sep. 21, 2021 (JP) .................. 2021-153462

(51) Int. Cl.
*H01L 21/306* (2006.01)
*B01D 53/02* (2006.01)
*C23C 16/44* (2006.01)
*H01J 37/32* (2006.01)

(52) U.S. Cl.
CPC .......... *C23C 16/4412* (2013.01); *B01D 53/02* (2013.01); *H01J 37/3244* (2013.01); *H01J 37/32834* (2013.01); *H01J 37/32844* (2013.01); *B01D 2253/204* (2013.01); *B01D 2257/60* (2013.01)

(58) Field of Classification Search
CPC ............. H01J 37/3244; H01J 37/32449; H01J 37/32834; H01J 37/32844; C23C 16/4401; C23C 16/4402; C23C 16/4408; C23C 16/448; C23C 16/4481; C23C 16/4482; C23C 16/4483; C23C 16/455; C23C 16/45544; C23C 16/45561; C23C 16/4412; C07C 63/26; C07C 63/28; C07C 63/307; C07C 63/313; C07C 63/42; C07C 63/44; C07C 63/48; C07F 1/08; C07F 5/00; C07F 11/00; C07F 15/02; B01D 53/04; B01J 20/226
See application file for complete search history.

(56) References Cited

U.S. PATENT DOCUMENTS

| | | | | |
|---|---|---|---|---|
| 6,500,299 B1* | 12/2002 | Mett | ............... | C23C 16/455 118/728 |
| 2011/0163452 A1* | 7/2011 | Horii | ............... | H01L 21/28194 257/E23.141 |
| 2011/0256041 A1* | 10/2011 | Ho | ............... | C23C 16/4402 210/172.6 |
| 2015/0004499 A1* | 1/2015 | Kitagawa | ............... | H01G 11/54 252/62.2 |
| 2015/0034500 A1* | 2/2015 | Kim | ............... | B01J 20/28016 423/406 |

(Continued)

FOREIGN PATENT DOCUMENTS

| | | |
|---|---|---|
| JP | 2001-214272 A | 8/2001 |
| JP | 2005-093526 A | 4/2005 |

(Continued)

*Primary Examiner* — Luz L Alejandro Mulero
(74) *Attorney, Agent, or Firm* — Armstrong Teasdale LLP

(57) ABSTRACT

A substrate processing apparatus includes a processing chamber configured to process a substrate, and a filtration part containing a porous coordination polymer and provided in an exhaust path configured to exhaust a gas from the processing chamber.

7 Claims, 4 Drawing Sheets

(56) References Cited

U.S. PATENT DOCUMENTS

| | | | | |
|---|---|---|---|---|
| 2015/0136027 A1* | 5/2015 | Hara | .................. | C23C 16/46 |
| | | | | 118/724 |
| 2016/0160348 A1* | 6/2016 | Siu | .................. | C07F 3/06 |
| | | | | 521/50 |
| 2022/0372623 A1* | 11/2022 | Harada | .................. | B01J 20/00 |
| 2022/0403511 A1* | 12/2022 | Yamazaki | ............... | C23C 16/40 |

FOREIGN PATENT DOCUMENTS

| | | | |
|---|---|---|---|
| JP | 2018-111878 A | 7/2018 | |
| JP | 2021-075739 A | 5/2021 | |
| JP | 2021-077676 A | 5/2021 | |
| WO | WO-2021090723 A1 * | 5/2021 | ............. B01D 53/04 |

* cited by examiner

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2021-153462, filed on Sep. 21, 2021, the entire contents of which are incorporated herein by reference.

TECHNICAL FIELD

The present disclosure relates to a substrate processing apparatus and a substrate processing method.

BACKGROUND

Patent Document 1 discloses an exhaust system structure of a film forming apparatus capable of completely removing an unreacted raw material gas and a reaction by-product thereof.

Patent Document 2 discloses, in supplying a processing gas for processing a substrate for manufacturing a semiconductor device, an apparatus including a concentration tank in which a porous member is accommodated and a desorption mechanism configured to desorb the processing gas adsorbed on the porous member. Patent Document 2 discloses that the porous member includes a metal-organic framework configured to preferentially adsorb a processing gas mixed with a carrier gas.

Patent Document 3 discloses an apparatus for processing a substrate for manufacturing a semiconductor device, wherein the apparatus includes a processing gas supplier configured to supply a processing gas to a chamber in which the substrate is accommodated. Patent Document 3 discloses that the processing gas supplier includes a raw material cartridge including a raw material tank containing a porous member containing a metal-organic framework in which gas molecules of the raw material of the processing gas are adsorbed.

PRIOR ART DOCUMENT

Patent Documents

Patent Document 1: Japanese Laid-Open Publication No. 2001-214272
Patent Document 2: Japanese Laid-Open Publication No. 2021-075739
Patent Document 2: Japanese Laid-Open Publication No. 2021-077676

SUMMARY

According to one embodiment of the present disclosure, there is provided a substrate processing apparatus includes a processing chamber configured to process a substrate, and a filtration part containing a porous coordination polymer and provided in an exhaust path configured to exhaust a gas from the processing chamber.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
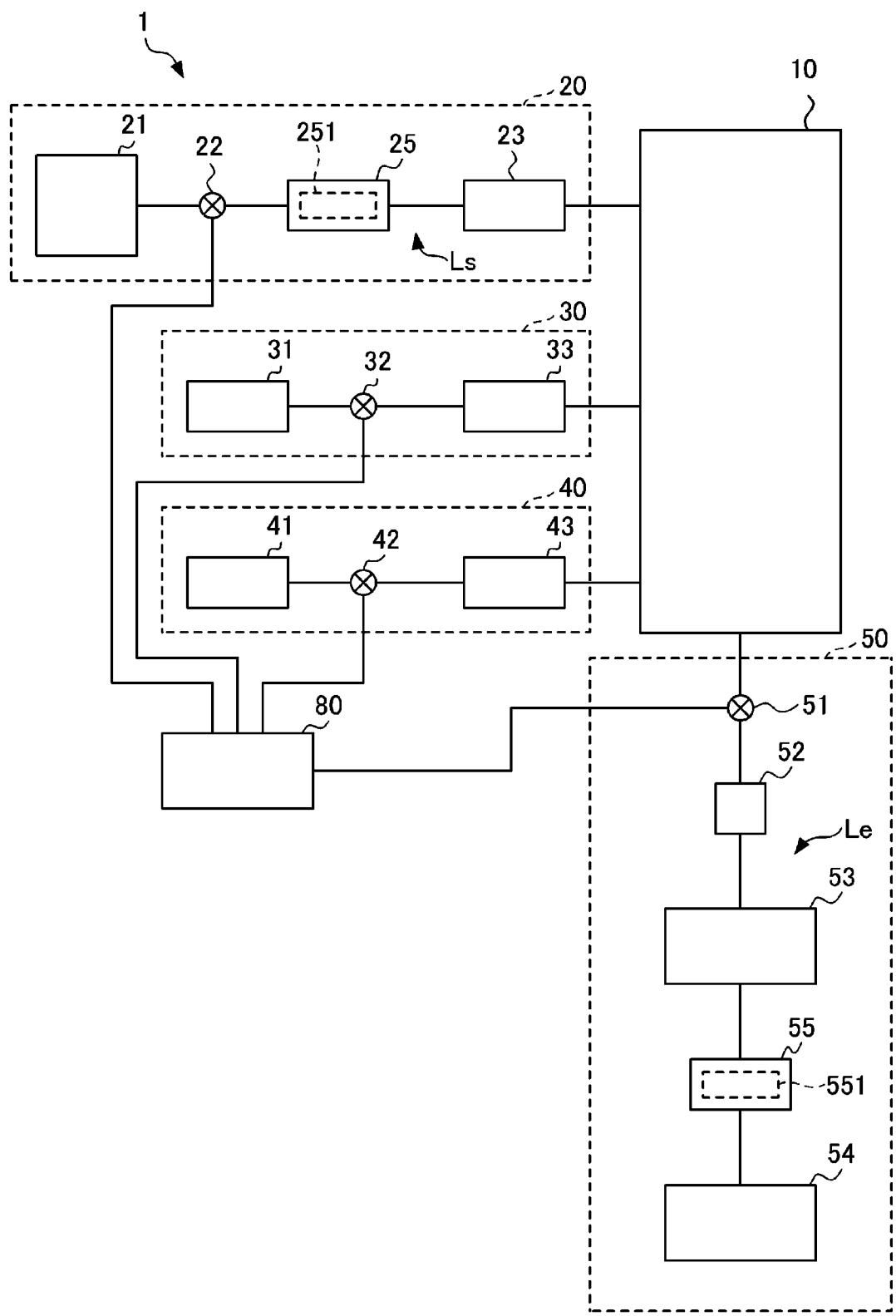
FIG. 1 is a view illustrating a schematic configuration of an example of a substrate processing apparatus according to a first embodiment.

Hereinafter, embodiments for carrying out the present disclosure will be described with reference to drawings. In the specification and drawings, constituent elements that are substantially the same will be denoted by the same reference numerals, and redundant descriptions will be omitted. In order to facilitate understanding, the scale of each part in the drawings may differ from the actual scale. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the directions of parallel, right angle, orthogonal, horizontal, vertical, up/down, left/right, and the like, a deviation that does not impair the effect of an embodiment is allowed. The shape of a corner portion is not limited to a right angle, and may be rounded in a bow shape. The terms parallel, right-angled, orthogonal, horizontal, and vertical may include substantially parallel, substantially right-angled, substantially orthogonal, substantially horizontal, and substantially vertical, respectively.

First Embodiment

<Substrate Processing Apparatus 1>

A substrate processing apparatus 1 which is an example of a substrate processing apparatus according to a first embodiment and a substrate processing method using the substrate processing apparatus 1 will be described. FIG. 1 is a view illustrating a schematic configuration of the substrate processing apparatus 1 which is an example of the substrate processing apparatus according to the first embodiment.

The substrate processing apparatus 1 is a film forming apparatus that forms a thin film of a metal or a metal compound on a substrate. The substrate processing apparatus 1 forms a thin film through, for example, an atomic layer deposition (ALD) method or a chemical vapor deposition (CVD) method. The substrate processing apparatus 1 supplies a raw material gas and a reaction gas to a substrate placed inside a processing chamber 10 so that the raw material gas reacts with the reaction gas to form a thin film on the substrate. The substrate processing apparatus 1 is not limited to the film forming apparatus, and may be an apparatus for processing a substrate, such as an etching apparatus.

The substrate processing apparatus 1 includes the processing chamber 10, a raw material gas supplier 20, a reaction gas supplier 30, a purge gas supplier 40, a gas exhauster 50, and a controller 80. Each element will be described.

[Processing Chamber 10]

The processing chamber 10 forms a thin film on a substrate therein. The processing chamber 10 includes a substrate support on which the substrate is placed. The substrate is processed in the state of being placed on the substrate support. When used in, for example, a batch-type film forming apparatus, the processing chamber 10 may include, as the substrate support, a wafer boat on which substrates are placed in multiple stages. For example, when used in a single-wafer-type film forming apparatus, the processing chamber 10 may be provided with a stage on which the substrate is placed, as the substrate support. For example, when used in a semi-batch type film forming apparatus, the processing chamber may be provided with a stage including a rotary table, as the substrate support.

The raw material gas supplier 20, the reaction gas supplier 30, and the purge gas supplier 40 are connected to the processing chamber 10. A raw material gas is supplied to the processing chamber 10 from the raw material gas supplier 20. In addition, a reaction gas is supplied to the processing chamber 10 from the reaction gas supplier 30. Further, a purge gas is supplied to the processing chamber 10 from the purge gas supplier 40.

Further, the gas exhauster 50 is connected to the processing chamber 10. The gas exhauster 50 exhausts the gas inside the processing chamber 10. The gas exhauster 50 exhausts the gas inside the processing chamber 10 to turn the interior of the processing chamber 10 into, for example, a vacuum state. Further, the gas exhauster 50 exhausts the gas inside the processing chamber 10 after substrate processing, and exhausts the raw material gas remaining inside the processing chamber 10 and a reaction-generated gas generated by the processing.

[Raw Material Gas Supplier 20]

The raw material gas supplier 20 supplies the raw material gas for forming a thin film to the processing chamber 10. The raw material gas supplied from the raw material gas supplier 20 is determined depending on a film to be formed on the substrate. The raw material gas is, for example, a gas such as aluminum trichloride ($AlCl_3$), titanium tetrachloride ($TiCl_4$), or tungsten pentachloride ($WCl_5$). The raw material gas contains a precursor constituting a film laminated on the substrate.

The raw material gas supplier 20 includes a raw material gas source 21, a raw material gas supply/cutoff valve 22, a flow rate adjuster 23, and a filtration part 25. A path from the raw material gas source 21 to the processing chamber 10 is referred to as a supply path Ls.

(Raw Material Gas Source 21)

The raw material gas source 21 supplies the raw material gas to the processing chamber 10. When a solid material is used as a raw material of the raw material gas, for example, when aluminum trichloride ($AlCl_3$) which is a solid metal halide is used, the raw material gas source 21 may include a heating device for vaporizing the solid material. In addition, for example, when the raw material of the raw material gas is dissolved in a solvent, the raw material gas source 21 may include a vaporizer that vaporizes the raw material gas by a direct liquid injection (DLI) method or the like. In addition, the raw material gas source 21 may include a storage apparatus such as a tank for storing the raw material gas when the raw material gas is capable of being stored as a single substance.

(Raw Material Gas Supply/Cutoff Valve 22)

The raw material gas supply/cutoff valve 22 performs the supply and cutoff of the raw material gas from the raw material gas source 21 to the processing chamber 10. The raw material gas supply/cutoff valve 22 is connected to the controller 80. The controller 80 controls the opening/closing of the raw material gas supply/cutoff valve 22.

(Flow Rate Adjuster 23)

The flow rate adjuster 23 controls a flow rate of the raw material gas supplied from the raw material gas source 21 to the processing chamber 10. The flow rate adjuster 23 is, for example, a mass flow controller (MFC).

(Filtration Part 25)

The filtration part 25 removes impurities contained in the raw material gas. The filtration part 25 is provided in the supply path Ls. In the filtration part 25, a process of adsorbing impurities is performed.

The filtration part 25 includes a filter 251 provided therein to have a porous coordination polymer (PCP). The porous coordination polymer is also referred to as a metal-organic framework (MOF). The porous coordination polymer contains a metal complex composed of a coordination bond between a metal ion and an organic ligand (an organic compound), and has a pore structure formed by accumulating a plurality of metal complexes. Details of the porous coordination polymer will be described later.

The porous coordination polymer contained in the filter 251 of the filtration part 25 selectively adsorbs impurities contained in the raw material gas supplied from the raw material gas source 21. The porous coordination polymer contained in the filter 251 of the filtration part 25 selectively adsorbs impurities contained in the raw material gas supplied from the raw material gas source 21 so that the purity of the raw material gas flowing into the processing chamber 10 is increased. By increasing the purity of the raw material gas flowing into the processing chamber 10, it is possible to improve the quality of the thin film formed on the substrate.

The impurities contained in the raw material gas supplied from the raw material gas source 21 are, for example, all substances that do not contribute to film formation. More specifically, as the impurities contained in the raw material gas supplied from the raw material gas source 21, for example, carbon, a metal such as iron or chromium, other specific particles, or the like may be considered. For example, when the DLI method is used, carbon contained in the solvent may be contained as an impurity. It is possible to increase the purity of the raw material gas supplied to the processing chamber 10 by selectively removing impurities such as carbon, a metal such as iron or chromium, other specific particles, and the like by the filter 251 containing a porous coordination polymer.

[Reaction Gas Supplier 30]

The reaction gas supplier 30 supplies the reaction gas to the processing chamber 10. The reaction gas is a gas that reacts with the raw material gas to form a film. For example, when a film made of aluminum nitride (AlN) is formed by a reaction with aluminum trichloride ($AlCl_3$), an ammonia ($NH_3$) gas is used as the reaction gas. For example, even when a film made of titanium nitride (TiN) is formed by a reaction with titanium tetrachloride ($TiCl_4$), the ammonia ($NH_3$) gas is used as the reaction gas.

The reaction gas supplier 30 includes a reaction gas source 31, a reaction gas supply/cutoff valve 32, and a flow rate adjuster 33.

(Reaction Gas Source 31)

The reaction gas source 31 supplies the reaction gas to the processing chamber 10. The reaction gas source 31 includes, for example, a storage apparatus such as a tank for storing the reaction gas.

(Reaction Gas Supply/cutoff Valve 32)

The reaction gas supply/cutoff valve 32 performs the supply and cutoff of the reaction gas from the reaction gas source 31 to the processing chamber 10. The reaction gas supply/cutoff valve 32 is connected to the controller 80. The controller 80 controls the opening/closing of the reaction gas supply/cutoff valve 32.

(Flow Rate Adjuster 33)

The flow rate adjuster 33 controls a flow rate of the reaction gas supplied from the reaction gas source 31 to the processing chamber 10. The flow rate adjuster 33 is, for example, a mass flow controller.

[Purge Gas Supplier 40]

The purge gas supplier 40 supplies the purge gas to the processing chamber 10. The purge gas is supplied when the raw material gas or the reaction gas inside the processing chamber 10 is discharged to the outside. The purge gas is, for example, a nitrogen gas.

The purge gas supplier 40 includes a purge gas source 41, a purge gas supply/cutoff valve 42, and a flow rate adjuster 43.

(Purge Gas Source 41)

The purge gas source 41 supplies the purge gas to the processing chamber 10. The purge gas source 41 includes, for example, a storage apparatus such as a tank for storing the purge gas.

(Purge Gas Supply/Cutoff Valve 42)

The purge gas supply/cutoff valve 42 performs the supply and cutoff of the purge gas from the purge gas source 41 to the processing chamber 10. The purge gas supply/cutoff valve 42 is connected to the controller 80. The controller 80 controls the opening/closing of the purge gas supply/cutoff valve 42.

(Flow Rate Adjuster 43)

The flow rate adjuster 43 controls a flow rate of the purge gas supplied from the purge gas source 41 to the processing chamber 10. The flow rate adjuster 43 is, for example, a mass flow controller.

[Gas Exhauster 50]

The gas exhauster 50 discharges the gas inside the processing chamber 10 to the outside. The gas exhauster 50 includes a discharge valve 51, a pressure adjuster 52, an exhaust pump 53, an exhaust gas processing part 54, and a filtration part 55. A path from the processing chamber 10 to the exhaust gas processing part 54 is referred to as an exhaust gas path Le.

(Discharge Valve 51)

The discharge valve 51 performs the exhaust and cutoff of the exhaust gas from the processing chamber 10 to the exhaust pump 53. The discharge valve 51 is connected to the controller 80. The controller 80 controls the opening/closing of the discharge valve 51.

(Pressure Adjuster 52)

The pressure adjuster 52 adjusts an internal pressure of the processing chamber 10. The pressure adjuster 52 is, for example, a fully automatic pressure controller (APC). The internal pressure of the processing chamber 10 is adjusted to a desired pressure by the pressure adjuster 52.

(Exhaust Pump 53)

The exhaust pump 53 exhausts the gas inside the processing chamber 10. The gas (exhaust gas) exhausted by the exhaust pump 53 includes the raw material gas, the reaction gas, and the purge gas. In addition, the gas (exhaust gas) exhausted by the exhaust pump 53 also includes a reaction by-product generated by the reaction between the raw material gas and the reaction gas.

The exhaust pump 53 is a vacuum pump such as a turbo molecular pump, a dry pump, or a combination thereof (Exhaust Gas Processing Part 54)

The exhaust gas processing part 54 performs adsorption, water washing, chemical neutralization processing, and the like of the exhaust gas exhausted from the exhaust pump 53, and discharges the exhaust gas to the outside, for example, into the air.

(Filtration Part 55)

The filtration part 55 recovers the raw material gas contained in the exhaust gas. The filtration part 55 is provided in the exhaust path Le. The filtration part 55 includes a filter 551 provided therein to contain a porous coordination polymer. In the filtration part 55, a process of adsorbing the raw material gas is performed.

The porous coordination polymer contained in the filter 551 of the filtration part 55 selectively adsorbs the raw material gas. The porous coordination polymer contained in the filter 551 of the filtration part 55 recovers the raw material gas by selectively adsorbing the raw material gas. That is, by using the filter 551 formed of the porous coordination polymer, it is possible to selectively adsorb and recover the precursor contained in the raw material gas.

The filter 551 is provided to be replaceable. The filter 551 that has adsorbed the raw material gas is removed, and a new filter 551 is installed. By extracting the adsorbed raw material gas from the removed filter 551, the raw material gas contained in the exhaust gas is reusable.

In the CVD process or ALD process for forming a thin film, a ratio of the precursor contained in the raw material gas, for example, the aluminum trichloride, formed on the substrate is less than a few percent. Therefore, the utilization efficiency of the precursor contained in the raw material gas is very low. That is, most of the precursor is discharged from the processing chamber 10. In the related art, the discharged precursors were discarded.

The filter 551 is able to recover the precursor contained in the exhaust gas, and to desorb the recovered precursor from the porous coordination polymer by performing heating or the like of the recovered precursor. Therefore, it is possible to take out again and reuse the precursor adsorbed by the filter 551 formed of the porous coordination polymer. By reusing the precursor, it is possible to effectively use the precursor that was discarded in the related art.

In the foregoing description, the recovery of the raw material gas, particularly the precursor contained in the raw material gas, has been described, but the recovered gas is not limited to the raw material gas. For example, a porous coordination polymer that selectively adsorbs a gas to be reused in the gases contained in the exhaust gas, for example, the reaction gas, the purge gas, or the like, may be used to adsorb and recover the gas to be reused. Without being limited to the gas, a solid such as a reaction by-product may be adsorbed.

[Controller 80]

The controller 80 is constituted with a computer including an arithmetic operation part and a storage part. The controller 80 controls each part of the substrate processing apparatus 1. The arithmetic operation part includes, for example, a central processing unit (CPU). The storage part includes, for example, a random access memory (RAM), a read only memory (ROM), a hard disk drive (HDD), a solid state drive, or a combination thereof.

The storage part stores a program in which a group of steps (instructions) for executing an operation required for film formation processing of the substrate is set. The program includes a group of steps to control the opening/closing operations of, for example, the raw material gas supply/cutoff valve 22, the reaction gas supply/cutoff valve 32, the purge gas supply/cutoff valve 42, and the discharge valve 51 so that the raw material gas and the reaction gas are alternately supplied to the processing chamber 10. The program is stored in a storage medium such as a hard disk, a compact disk, a magneto-optical disk, or a memory card, and is installed in the computer from the storage medium.

The process of the controller 80 will be described, and the process of processing the substrate will be described. First, as a preparation before the formation of a film, the substrate is carried into the processing chamber 10, and the controller 80 adjusts the internal pressure of the processing chamber 10 and the temperature of the substrate. Then, the controller 80 opens the discharge valve 51, exhausts the gas by the exhaust pump 53, and adjusts the internal pressure at the time of film formation. Then, the controller 80 opens the raw material gas supply/cutoff valve 22 and closes the other valves to supply the raw material gas to the processing chamber 10 while adjusting the flow rate of the raw material gas by the flow rate adjuster 23. Inside the processing chamber 10, the raw material gas is adsorbed on the surface of the substrate.

Subsequently, the controller 80 opens the purge gas supply/cutoff valve 42 and the discharge valve 51, closes the other valves to supply the purge gas to the processing chamber 10, and replaces the raw material gas in the processing chamber 10 with the purge gas.

Subsequently, the controller 80 opens the reaction gas supply/cutoff valve 32 and closes the other valves to supply the reaction gas to the processing chamber 10. Inside the processing chamber 10, the raw material gas adsorbed on the surface of the substrate reacts with the reaction gas to form a thin film, for example, a single molecular layer. Then, the controller 80 opens the purge gas supply/cutoff valve 42 and the discharge valve 51, closes the other valves to supply the purge gas to the processing chamber 10, and replaces the reaction gas in the processing chamber 10 with the purge gas.

The controller 80 controls the raw material gas supply/cutoff valve 22, the reaction gas supply/cutoff valve 32, the purge gas supply/cutoff valve 42, and the discharge valve 51 so that the raw material gas and the reaction gas are alternately supplied to the processing chamber 10 in the order of the raw material gas, the purge gas, the reaction gas, and the purge gas. Then, by repeating the supply of the raw material gas and the reaction gas, a film having a desired thickness is formed.

<Porous Coordination Polymer Used in Filtration Part 25 and Filtration Part 55>

Figure 2:
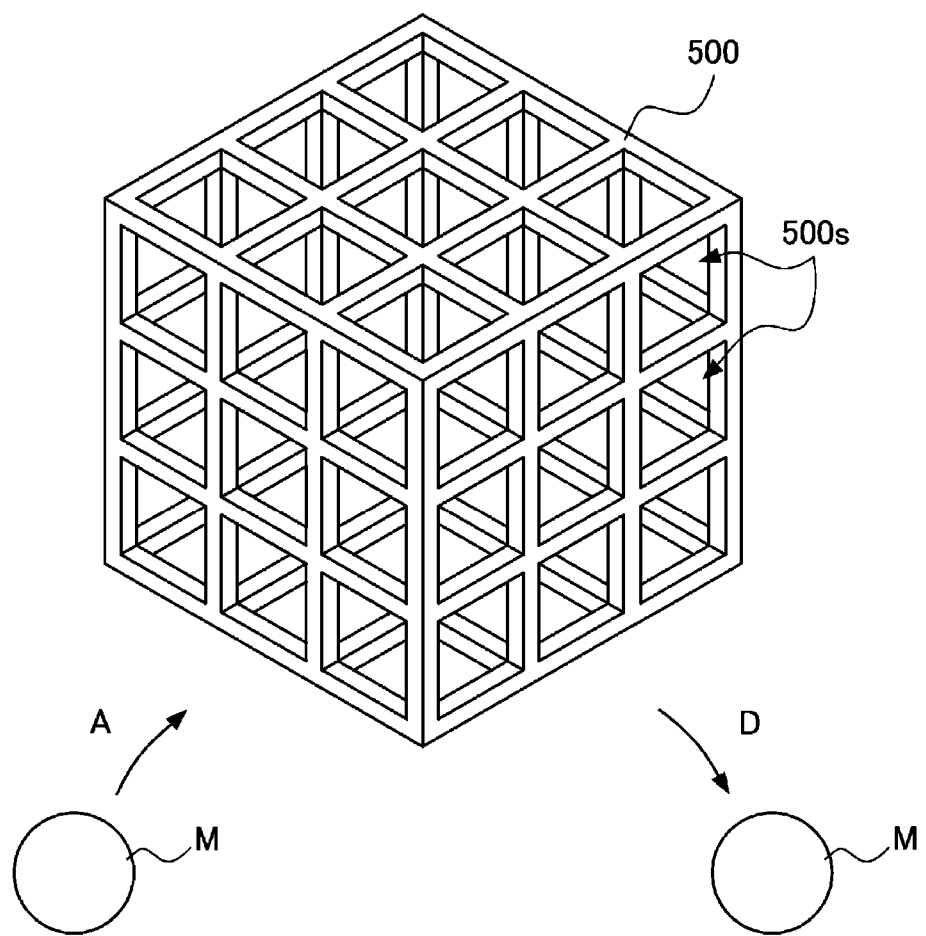
FIG. 2 is a view for explaining a porous coordination polymer used in the example of the substrate processing apparatus according to the first embodiment.
Figure 3:
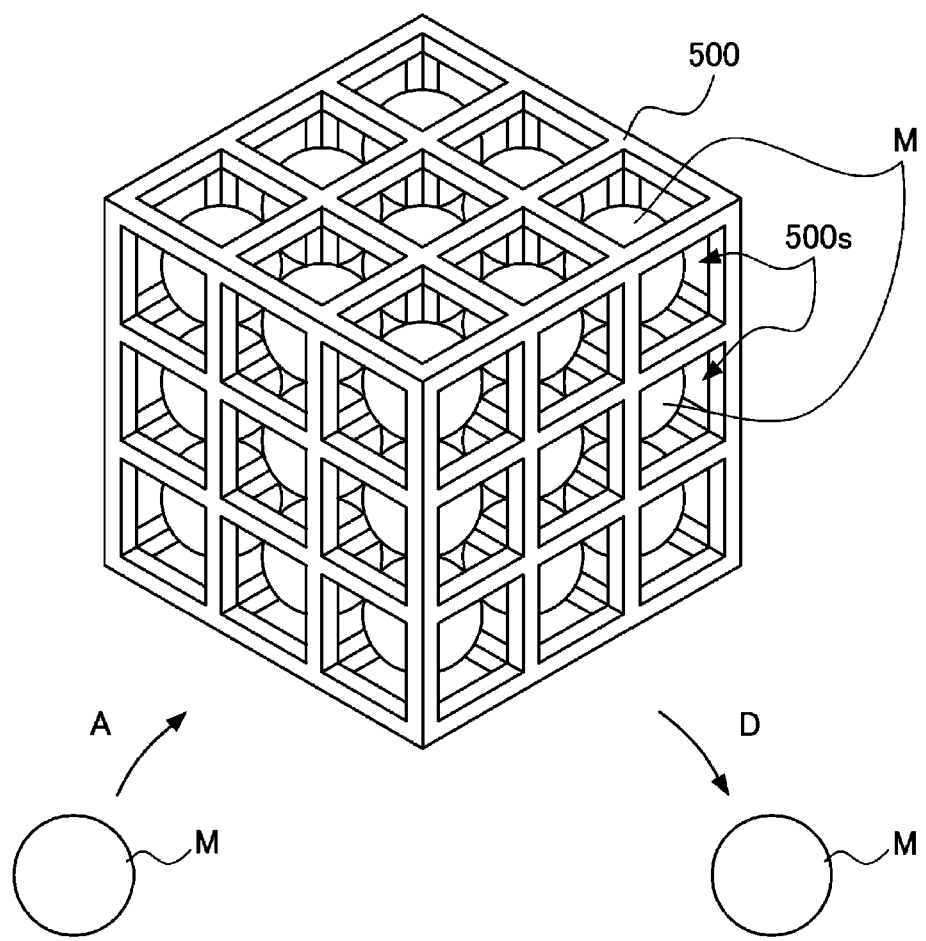
FIG. 3 is a view for explaining a porous coordination polymer used in the example of the substrate processing apparatus according to the first embodiment.
Figure 4:
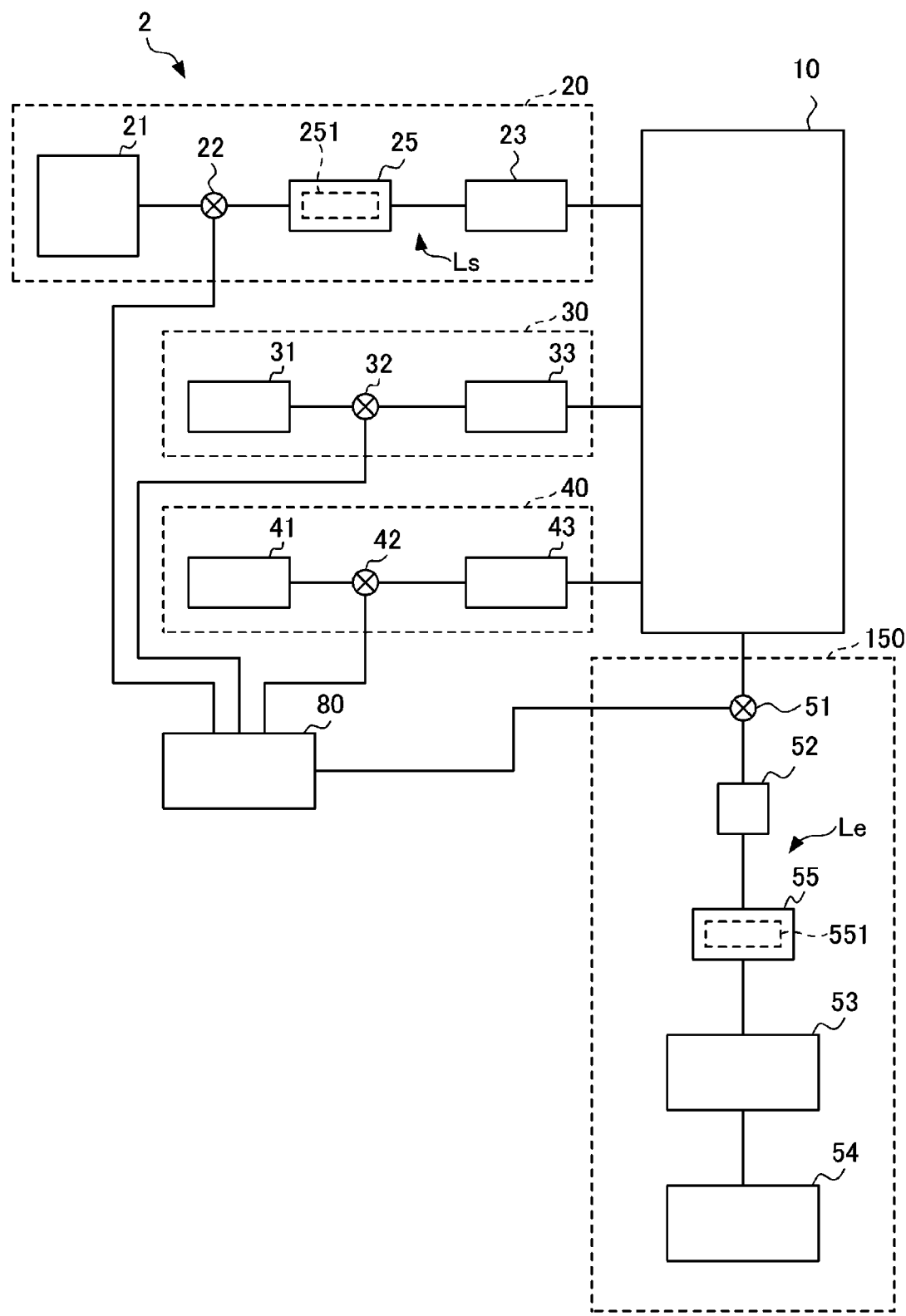
FIG. 4 is a view illustrating a schematic configuration of an example of a substrate processing apparatus according to a second embodiment.

The porous coordination polymer contained in the filter 251 of the filtration part 25 and the filter 551 of the filtration part 55 will be described. FIGS. 2 and 3 are views for explaining a porous coordination polymer 500 used in an example of the substrate processing apparatus according to the first embodiment.

The porous coordination polymer is formed by coordination bonds between metal ions and organic ligands. The porous coordination polymer has a crystalline polymer structure in which metal ions are linked by crosslinkable organic ligands and spaces are included. In the porous coordination polymer formed by accumulating a plurality of metal complexes, metal ions and organic ligands are regularly bonded. Since the metal ions and the organic ligands are regularly bonded, for example, as schematically illustrated in FIGS. 2 and 3, the porous coordination polymer 500 has a structure in which nanometer-sized pores 500s are regularly and three-dimensionally arranged.

As indicated by arrow A, with respect to the porous coordination polymer 500 having the structure in which the nanometer-sized pores 500s are regularly and three-dimensionally arranged (FIG. 3), a molecule M to be adsorbed is adsorbed to enter one pore 500s. The molecule M to be adsorbed is also adsorbed inside the pores 500s. In addition, as indicated by arrow D, an adsorbed molecule M leaves a pore 500s.

A solution method, which is one of methods for producing a porous coordination polymer, forms a porous coordination polymer by mixing a solution of metal ions and organic ligands at normal temperature and pressure. Accumulation of metal complexes proceeds in the solution in a self-assembling manner. The porous coordination polymer is relatively easy to manufacture, and since the size and shape of the pores 500s are controllable by selecting metal ions and organic ligands and adjusting the synthesis conditions, the porous coordination polymer has a high degree of freedom in design. The pores 500s of the porous coordination polymer 500 are designed depending on the molecules M to be adsorbed on the porous coordination polymer 500.

The porous coordination polymer contained in the filter 251 or the filter 551 is formed in the form of, for example, pellets, powder, or granules smaller than pellets.

[Porosity Coordination Polymer Used for Filter 251]

In the filter 251, for example, when carbon dioxide contained in the raw material gas is used as impurities to remove carbon dioxide, it is desirable to use a porous coordination polymer that selectively adsorbs carbon dioxide for the filter 251.

Examples of the porous coordination polymer that selectively adsorbs carbon dioxide include those selected from the group of porous coordination polymers described in the following (a) and (b):

(a) a porous coordination polymer that contains a metal complex composed of a coordination bond between a magnesium ion and 2,5-dihydroxyterephthalic acid as a ligand, and has a pore structure formed by accumulating a plurality of metal complexes; and (b) a porous coordination polymer that contains a metal complex composed of a coordination bond between a zinc cluster ion ($Zn_4O$) and 4,4',4"-(benzene-1,3,5-triyl-tris (benzene-4,1-diyl)) tribenzoate, and has a pore structure formed by accumulating a plurality of metal complexes.

Example of Porous Coordination Polymer Used for Filter 551

In the filter 551, for example, when recovering aluminum trichloride ($AlCl_3$) as the raw material gas in the exhaust gas, it is desirable to use a porous coordination polymer that selectively adsorbs aluminum trichloride ($AlCl_3$) for the filter 551.

Examples of the porous coordination polymer that selectively adsorbs aluminum trichloride ($AlCl_3$) include those selected from porous coordination polymer groups described in the following (c) to (f):

(c) a porous coordination polymer that contains a metal complex composed of a coordination bond between a copper ion and 1,3,5-benzenetricarboxylic acid and has a pore structure formed by accumulating a plurality of metal complexes;

(d) a porous coordination polymer that contains a metal complex composed of a coordination bond between an iron ion and 1,3,5-benzenetricarboxylic acid and has a pore structure formed by accumulating a plurality of metal complexes;

(e) a porous coordination polymer that contains a metal complex composed of a coordination bond between a chromium ion and terephthalic acid and has a pore structure formed by accumulating a plurality of metal complexes; and (f) a porous coordination polymer that contains a metal complex composed of a coordinate bond between a lanthanum ion and 1,3,5-tris (4-carboxyphenyl) benzene and has a pore structure formed by accumulating a plurality of metal complexes.

<Action/Effect>

With the substrate processing apparatus 1 according to the first embodiment, it is possible to recover a raw material gas contained in the exhaust gas from the processing chamber 10 by the filter part 55. In addition, it is possible to reuse the raw material gas recovered by the filtration part 55.

In a CVD process or ALD process for forming a thin film, a ratio at which a precursor contained in the raw material gas, for example, aluminum trichloride, forms a film on the substrate is less than a few percent. Therefore, the utilization efficiency of the precursor contained in the raw material gas is very low. That is, most of the precursor is discharged from the processing chamber 10. In the related art, the discharged precursor was discarded.

The substrate processing apparatus 1 according to the first embodiment is capable of selectively adsorbing and recovering the precursor contained in the raw material gas by using the filter 551 formed of the porous coordination polymer. In addition, molecules adsorbed by the porous coordination polymer can be desorbed from the porous coordination polymer by performing, for example, heating or the like. Therefore, with the substrate processing apparatus 1 according to the first embodiment, it is possible to take out again and reuse the precursor adsorbed by the filter 551 formed of the porous coordination polymer. By reusing, it is possible to reuse the precursor which has been discarded in the related art.

Second Embodiment

<Substrate Processing Apparatus 2>

A substrate processing apparatus 2 according to a second embodiment is different from the substrate processing apparatus 1 according to the first embodiment in terms of the position of the exhaust pump 53 relative to the filtration part 55. The gas exhauster 50 of the substrate processing apparatus 1 according to the first embodiment includes the exhaust pump 53 on the side of the processing chamber 10 of the filtration part 55. On the other hand, a gas exhauster 150 of the substrate processing apparatus 2 according to the second embodiment includes the exhaust pump 53 on the side opposite to the processing chamber 10 of the filtration part 55.

<Action/Effect>

With the substrate processing apparatus 2 according to the second embodiment, in addition to the action/effect of the substrate processing apparatus 1 according to the first embodiment, it is possible to prevent contamination of the exhaust pump 53 by a precursor by capturing the precursor by the filter 551 in front of the exhaust pump 53. By preventing the exhaust pump 53 from being contaminated, it is possible to increase the operating time of the exhaust pump 53. In addition, by preventing the exhaust pump 53 from being contaminated, it is possible to reduce the number of maintenances of the substrate processing apparatus 2.

The present disclosure provides a technique that recovers a gas contained in an exhaust gas from a processing chamber.

It should be understood that the embodiments disclosed herein are exemplary in all respects and is not restrictive. The above-described embodiments may be modified and improved in various forms without departing from the scope and spirit of the appended claims. The matters described in in the plurality of embodiments may take other configurations within a non-contradictory range, and may be combined within a non-contradictory range.

What is claimed is:

1. A substrate processing apparatus comprising:
a processing chamber configured to process a substrate;
a gas source configured to supply a gas containing aluminum trichloride and carbon to the processing chamber;
a first filtration part provided in a supply path configured to supply the gas from the gas source to the processing chamber, and containing a first porous coordination polymer that selectively adsorbs carbon contained in the gas supplied to the processing chamber; and
a second filtration part provided in an exhaust path configured to exhaust a gas from the processing chamber, and containing a second porous coordination polymer that selectively adsorbs aluminum trichloride contained in the gas exhausted from the processing chamber,
wherein the first porous coordination polymer is a porous coordination polymer that contains a metal complex composed of a coordination bond between a zinc cluster ion ($Zn_4O$) and 4,4',4"-(benzene-1,3,5-triyl-tris (benzene-4,1-diyl)) tribenzoate, and has a pore structure formed by accumulating a plurality of metal complexes, and
wherein the second porous coordination polymer is selected from the group consisting of:
a porous coordination polymer that contains a metal complex composed of a coordination bond between a copper ion and 1,3,5-benzenetricarboxylic acid and has a pore structure formed by accumulating a plurality of metal complexes;
a porous coordination polymer that contains a metal complex composed of a coordination bond between an iron ion and 1,3,5-benzenetricarboxylic acid and has a pore structure formed by accumulating a plurality of metal complexes;
a porous coordination polymer that contains a metal complex composed of a coordination bond between a chromium ion and terephthalic acid and has a pore structure formed by accumulating a plurality of metal complexes; and
a porous coordination polymer that contains a metal complex composed of a coordinate bond between a lanthanum ion and 1,3,5-tris (4-carboxyphenyl) benzene and has a pore structure formed by accumulating a plurality of metal complexes.

2. The substrate processing apparatus of claim 1, wherein the aluminum trichloride contained in the gas exhausted from the processing chamber forms a film laminated on the substrate.

3. The substrate processing apparatus of claim 2, further comprising:

an exhaust pump provided on a first side of the second filtration part close to the processing chamber in the exhaust path.

4. The substrate processing apparatus of claim 3, wherein the second porous coordination polymer is replaceable.

5. The substrate processing apparatus of claim 1, further comprising:
   an exhaust pump provided on a first side of the second filtration part close to the processing chamber in the exhaust path.

6. The substrate processing apparatus of claim 1, further comprising:
   an exhaust pump provided on a second side of the second filtration part opposite the processing chamber in the exhaust path.

7. The substrate processing apparatus of claim 1, wherein the second porous coordination polymer is replaceable.

* * * * *